(12) United States Patent
Honda et al.

(10) Patent No.: US 7,914,329 B2
(45) Date of Patent: Mar. 29, 2011

(54) CARD CONNECTOR

(75) Inventors: Yosuke Honda, Tokyo (JP); Takamitsu Wada, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 104 days.

(21) Appl. No.: 12/378,917

(22) Filed: Feb. 20, 2009

(65) Prior Publication Data

US 2009/0221182 A1 Sep. 3, 2009

(30) Foreign Application Priority Data

Feb. 28, 2008 (JP) ................................ 2008-048874

(51) Int. Cl.
*H01R 13/648* (2006.01)
(52) U.S. Cl. .................................................. 439/607.31
(58) Field of Classification Search ............. 439/607.31, 439/607.11, 607.01, 541.5, 101
See application file for complete search history.

(56) References Cited

U.S. PATENT DOCUMENTS

| | | | |
|---|---|---|---|
| 5,169,343 A | | 12/1992 | Andrews |
| 5,288,247 A | * | 2/1994 | Kaufman ................. 439/607.33 |
| 5,399,105 A | * | 3/1995 | Kaufman et al. ........ 439/607.19 |
| 5,478,260 A | * | 12/1995 | Kaufman et al. ........ 439/607.31 |

FOREIGN PATENT DOCUMENTS

| | | |
|---|---|---|
| JP | 4-225597 | 8/1992 |
| JP | 4-286885 | 10/1992 |
| JP | 9-511866 | 11/1997 |
| JP | 2001-135420 | 5/2001 |
| JP | 2001-160438 | 6/2001 |
| JP | 2002-008756 | 1/2002 |
| JP | 2006-324185 | 11/2006 |

OTHER PUBLICATIONS

Japanese Office Action with English translation of same.

* cited by examiner

*Primary Examiner* — Alexander Gilman
(74) *Attorney, Agent, or Firm* — Collard & Roe, P.C.

(57) ABSTRACT

A card connector comprises a plurality of contacts, a frame, a shell and a locator. Each of the plurality of contacts comprises a first portion extending in a first direction and a second portion extending in a second direction perpendicular to the first direction. Each contact has substantially an L-like shape. The frame has a front end portion and a rear end portion. The rear end portion holds, in part, the first portions of the contacts. The first portions extend into a space defined by the frame toward the front end portion in the first direction. The second portions extend away from the frame in the second direction. The shell is attached to the frame. The shell shields, in part, the second portions of the contacts. The locator is supported by the shell. The locator is distinct from the shell. The locator holds, in part, the second portions of the contacts so that the second portions penetrate the locator.

7 Claims, 9 Drawing Sheets

CARD CONNECTOR

CROSS REFERENCE TO RELATED APPLICATIONS

Applicants claim priority under 35 U.S.C. §119 of Japanese Application No. 2008-48874 filed Feb. 28, 2008.

BACKGROUND OF THE INVENTION

This invention relates to a card connector which is configured to detachably hold a card such as an IC card.

JP-A 2006-324185 discloses a card connector, the contents of which are incorporated herein by reference. The disclosed card connector comprises a shell and an accommodation portion for accommodating a card. The shell has protruding portions which serve as standoff portions. The standoff portions are fixed to a circuit board so that the card connector is mounted on the circuit board. The standoff portions provide a space between the accommodation portion of the mounted card connector and the circuit board. In other words, the height of the standoff portions determines a distance between the card and the circuit board.

The card connector disclosed in JP-A 2006-324185 has a problem that the standoff portions do not have enough strength to support the card connector. The rigid and strong standoff portions may be achieved by increasing the size of a housing. However, it decreases the productivity. In addition, the height of the standoff portions is limited to a certain level if the housing is obtained through a molding process.

SUMMARY OF THE INVENTION

It is an object of the present invention to provide a card connector having a high standoff portions with a certain level of strength.

In accordance with one aspect of the present invention, there is provided a card connector comprising a plurality of contacts, a frame, a shell and a locator. Each of the plurality of contacts comprises a first portion extending in a first direction and a second portion extending in a second direction perpendicular to the first direction. Each contact has substantially an L-like shape. The frame has a front end portion and a rear end portion. The rear end portion holds, in part, the first portions of the contacts. The first portions extend into a space defined by the frame toward the front end portion in the first direction. The second portions extend away from the frame in the second direction. The shell is attached to the frame. The shell shields, in part, the second portions of the contacts. The locator is supported by the shell. The locator is distinct from the shell. The locator holds, in part, the second portions of the contacts so that the second portions penetrate the locator.

An appreciation of the objectives of the present invention and a more complete understanding of its structure may be had by studying the following description of the preferred embodiment and by referring to the accompanying drawings.

Figure 1:
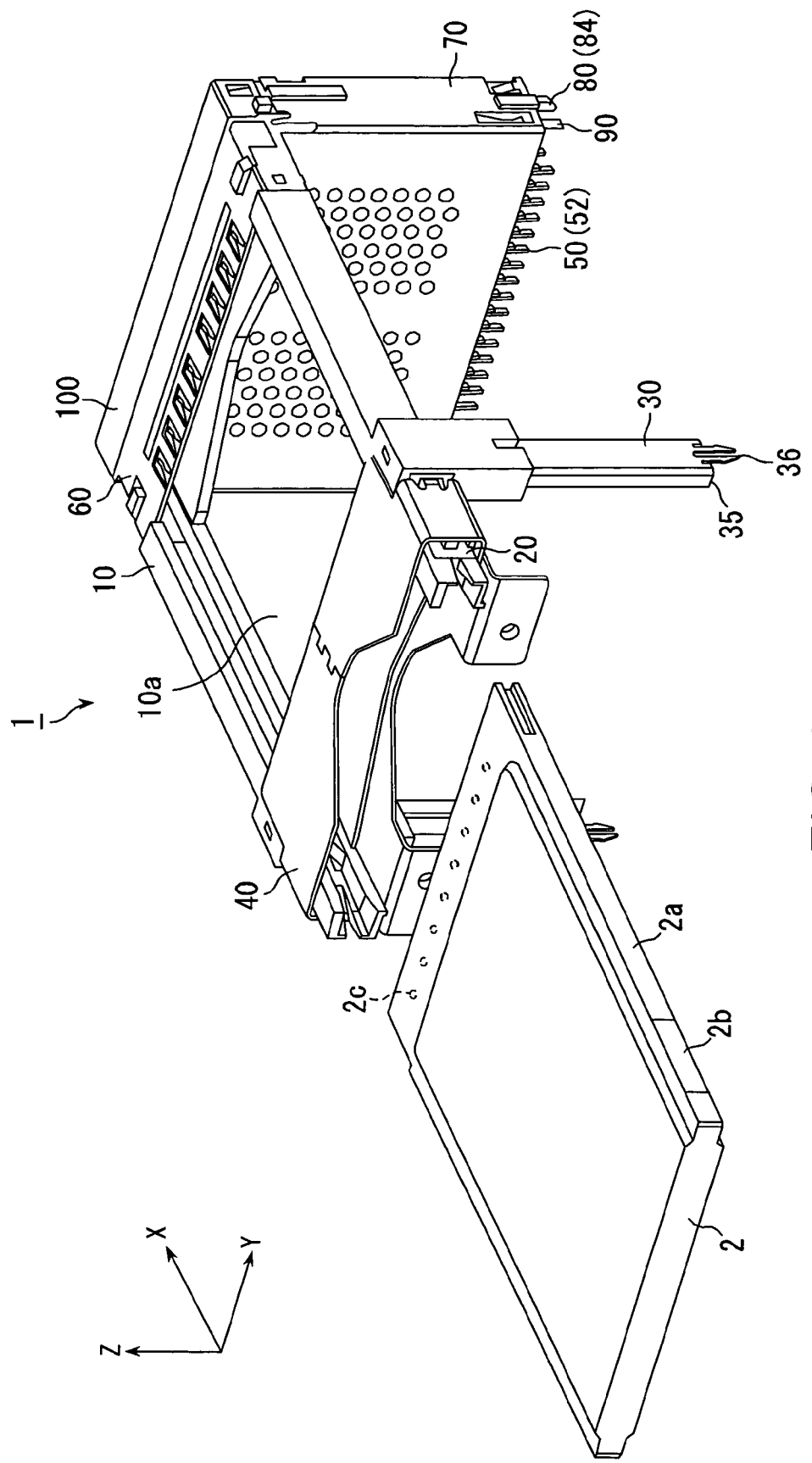
FIG. 1 is a right front oblique view showing a card connector according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENT

Figure 2:
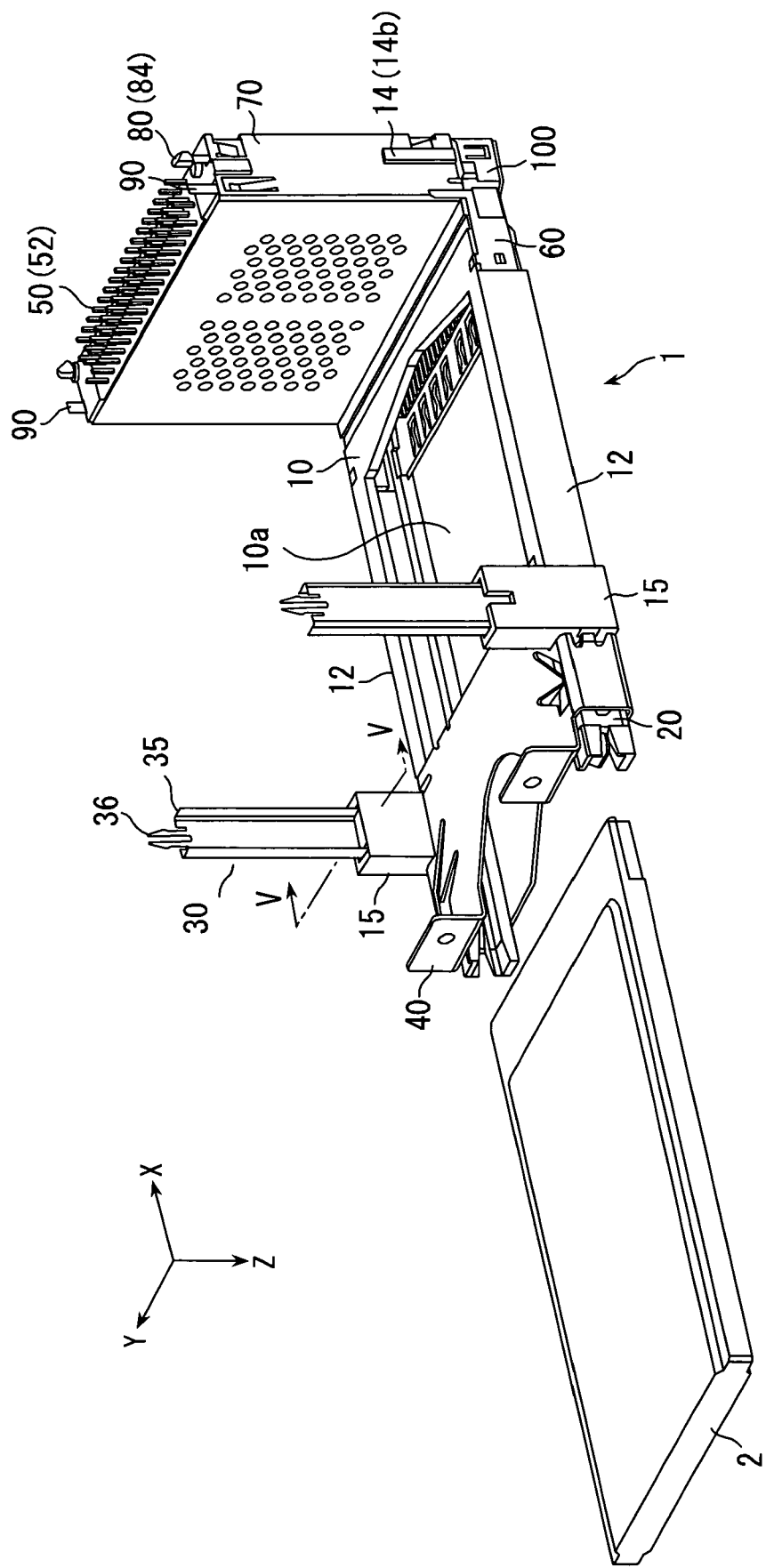
FIG. 2 is a left bottom oblique view showing the card connector of FIG. 1.

With reference to FIGS. 1 and 2, a card connector 1 according to an embodiment of the present invention is configured to hold a card 2 such as a PC card and to electrically connect terminals (not shown) of the card 2 with a circuit board (not shown). The card 2 has two side edges 2a and is provided with two electrodes 2b and a plurality of contact portions 2c. The electrodes 2b are formed on the side edges 2a, respectively. The contact portions 2c are arranged on a top surface and are positioned closer to an end of the card 2. The electrodes 2b and the contact portions 2c serve as ground contacts of the card 2.

Figure 3:
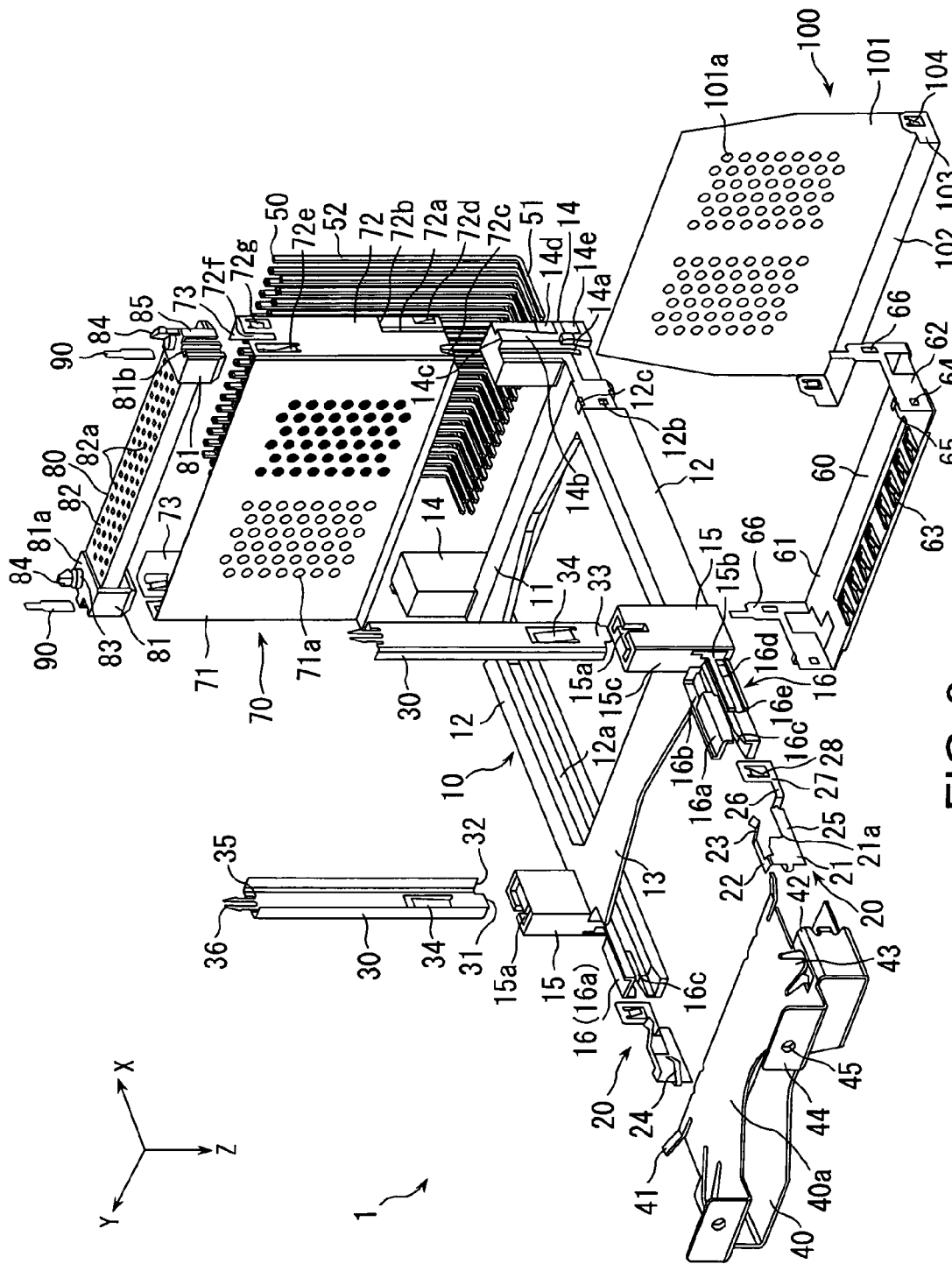
FIG. 3 is an exploded, perspective view showing the card connector of FIG. 2.

With reference to FIG. 3, the card connector 1 of the present embodiment comprises a frame 10, two ground lugs 20, two leg portions 30, a shield plate 40, a plurality of contacts 50, a ground plate 60, a lower shell 70, a locator 80, two posts 90, and an upper shell 100. In the present embodiment, the frame 10 and the locator 80 are made of insulator. The ground lugs 20, the leg portions 30, the shield plate 40, the contacts 50, the ground plate 60, the lower shell 70, the posts 90, and the upper shell 100 are made of metal.

Figure 4:
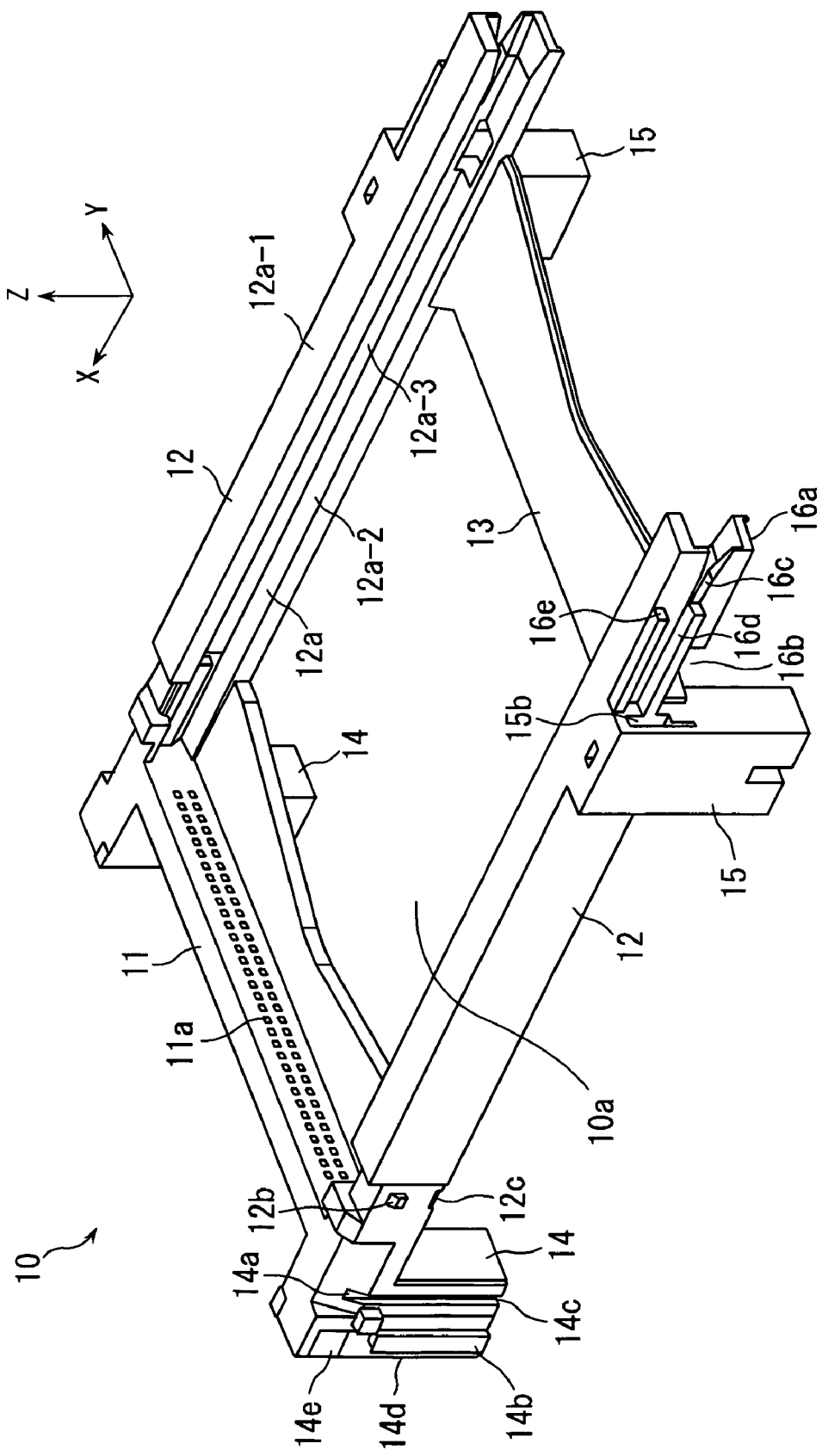
FIG. 4 is a left front oblique view showing a frame included in the card connector of FIG. 1.

With reference to FIGS. 3 and 4, the frame 10 comprises a base portion 11, two guide portions 12, a bridge portion 13, two back stand portions 14, two front stand portions 15, and two attached portions 16.

With reference to FIG. 4, the base portion 11 is formed with a plurality of holes, each of which penetrates the base portion 11 in an X-direction (a first direction). The base portion 11 has opposite ends in a Y-direction (a second direction). In other words, the base portion 11 extends along the Y-direction.

With reference to FIGS. 3 and 4, each guide portion 12 has a front end portion and a back end portion. The guide portions 12 extend forward from the respective ends of the base portion 11. In other words, the back end portions of the guide portions 12 are connected by the base portion 11, and the guide portions 12 extend along the X-direction. The guide portions 12 are arranged so that a space 10a is positioned between the guide portions 12 in the Y-direction; in the space 10a, the card 2 is placed in part, when the card 2 is held by the card connector 1. The guide portions 12 have guide grooves 12a, respectively, each of which extends in the X-direction. The guide grooves 12a guide the respective side edge 2a of the card 2. Each of the guide grooves 12a comprises an upper portion 12a-1, a lower portion 12a-2 and a guide wall 12a-3.

The guide groove 12a has an angular C-like shape when seen in the X-direction. Each guide portion 12 is further provided with a protrusion 12b and a recess 12c. The protrusion 12b is formed on an outer side surface of the back end portion of the guide portion 12. The recess 12c is formed on a bottom surface of the back end portion. The recess 12c reaches the outer side surface of the guide portion 12. In other words, one of the lower side edges of the guide portion 12 is partially depressed, as best shown in FIG. 3.

With reference to FIGS. 3 and 4, the bridge portion 13 has a thin plate-like shape. The bridge portion 13 connects the front end portions of the guide portions 12 in the Y-direction. More specifically, the bridge portion 13 connects the lower portions 12a-2 of the guide grooves 12a, as best shown in FIG. 4.

Figure 6:
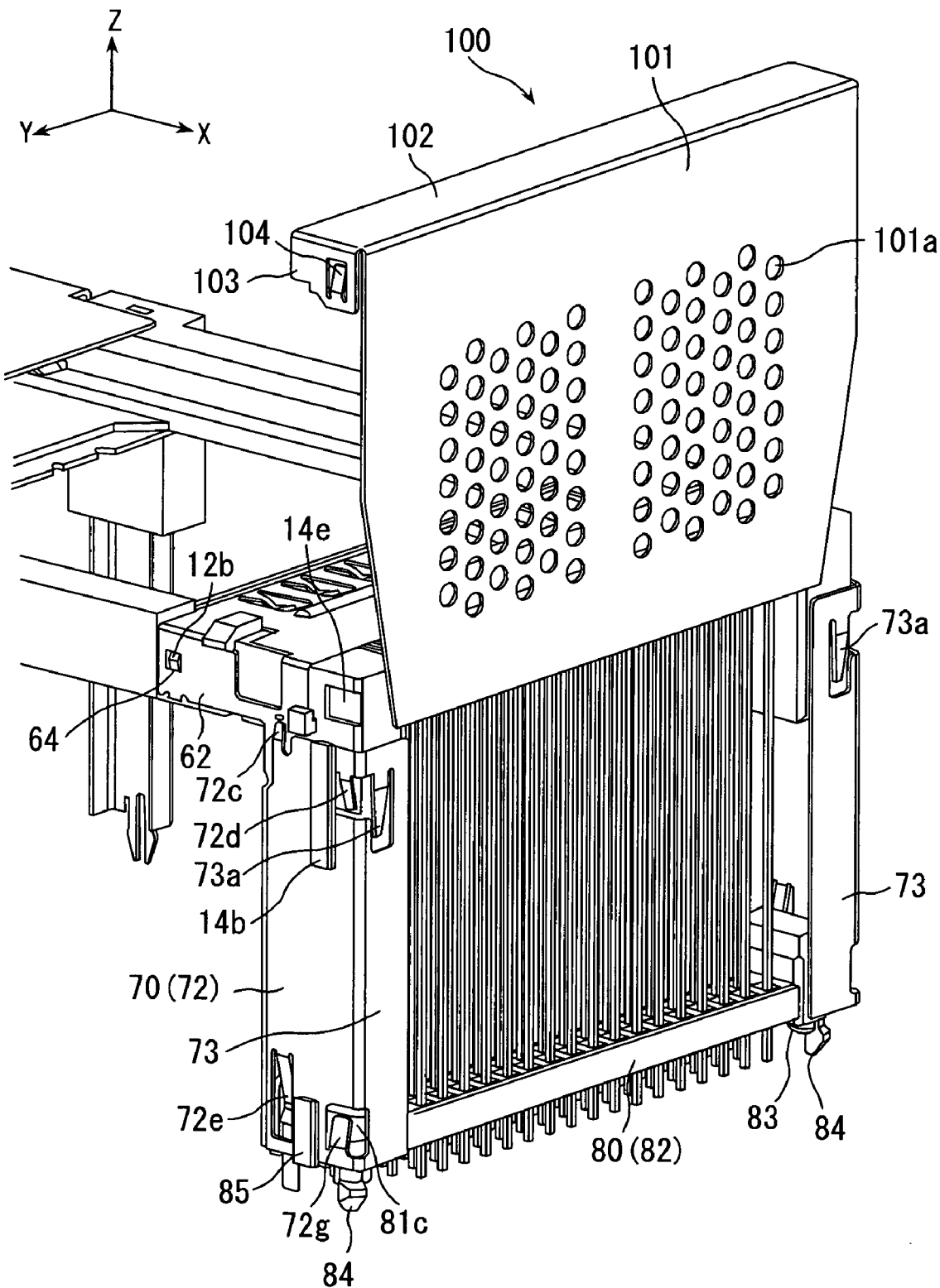
FIG. 6 is a right rear oblique view showing a part of the card connector of FIG. 2, wherein an upper shell is detached from a lower shell.

With reference to FIGS. 3, 4, and 6, the back stand portions 14 extend downward from the respective ends of the base portion 11. Each back stand portion 14 is provided with a slit 14a and a protrusion 14b. The slit 14a is formed on an outer side surface of the back stand portion 14 and extends in a Z-direction. The protrusion 14b is also formed on the outer side surface of the back stand portion 14 and extends in the Z-direction. The slit 14a and the protrusion 14b reach a lower end surface 14c of the back stand portion 14. In this embodiment, the protrusion 14b has a narrow portion and a wide portion and has a T-like shaped cross section in the X-Y plane. Each back stand portion 14 is further provided with recesses 14d and 14e, both of which are formed on the outer side surface of the back stand portion 14. The recess 14d is positioned below the recess 14e. In other words, the recess 14d is separated from the recess 14e in the Z-direction.

Figure 5:
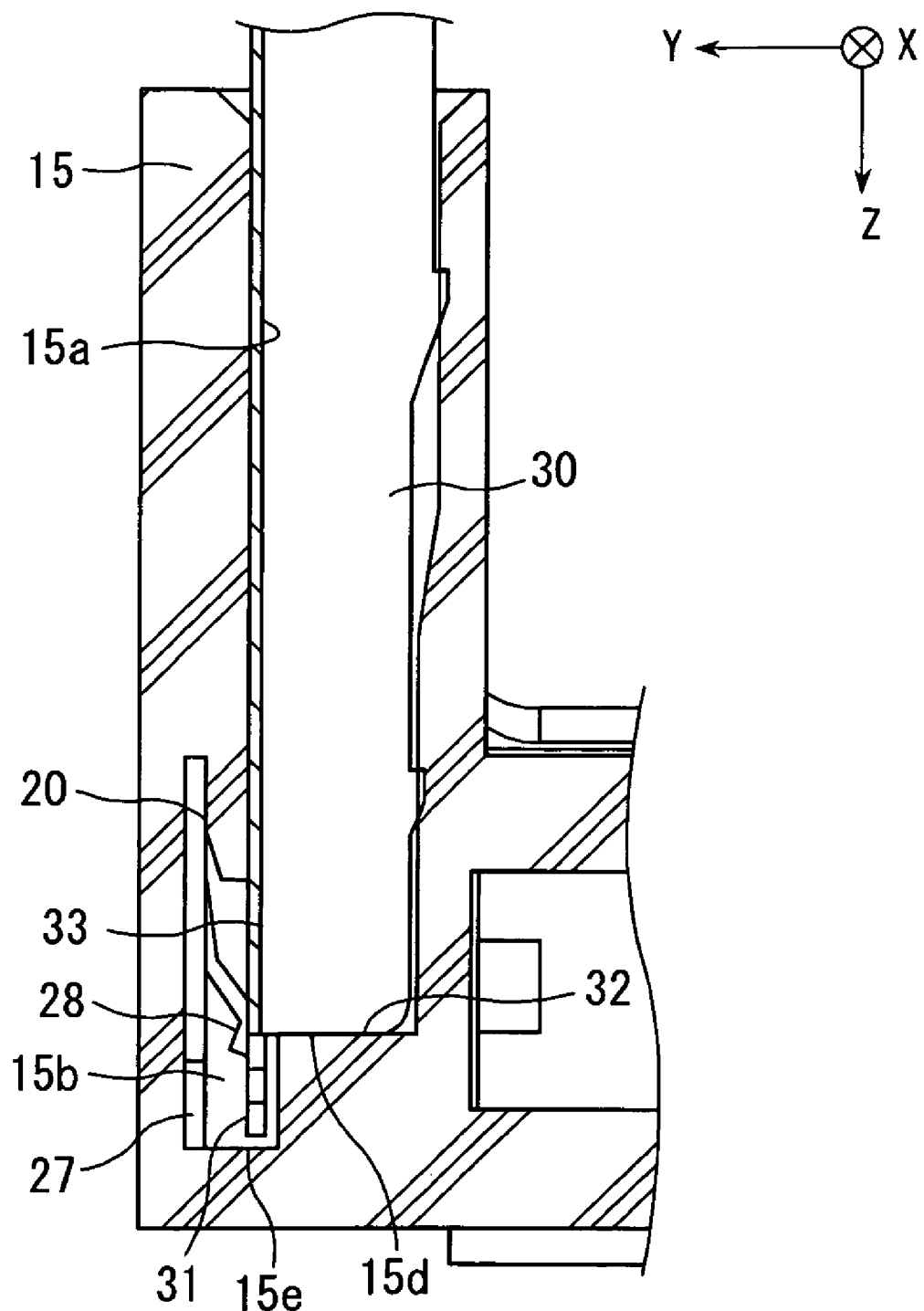
FIG. 5 is a cross-sectional view showing a part of the card connector of FIG. 2, taken along lines V-V.

With reference to FIG. 3, the two front stand portions 15 extend downward from the front end portions of the guide portions 12, respectively. Each front stand portions 15 is formed with a groove 15a and an accommodation portion 15b. The groove 15a has an angular U-like shaped cross section in the X-Y plane. The groove 15a is formed with a depression (not shown). As will be described later, the depression serves to fix a part of the leg portion 30. The accommodation portion 15b is a groove extending backward from a front surface 15c of the front stand portion 15. As shown in FIG. 5, the accommodation portion 15b communicates with the groove 15a within the front stand portion 15. In the present embodiment, a bottom portion 15d of the groove 15a is positioned lower than another bottom portion 15e of the accommodation portion 15b in the Z-direction.

With reference to FIG. 3, the attached portions 16 are formed as parts of the front end portions of the guide portions 12, respectively. With reference to FIGS. 3 and 4, each attached portion 16 has a bottom surface 16a, a depression 16b, a side slit 16c, and a groove 16d. The depression 16b is depressed from the bottom surface 16a when seen from the bottom of the card connector 1, as shown in FIG. 3. The side slit 16c is formed in the guide wall 12a-3. The side slit 16c extends along the X-direction and penetrates the attached portion 16 in the Y-direction. The groove 16d extends in the X-direction and has a T-like shaped cross section in the Y-Z plane.

With reference to FIG. 3, the ground lugs 20 serve to be electrically connected with the electrodes 2b of the card 2, respectively. Each ground lugs 20 comprises a main portion 21, a first spring portion 22, an end portion 23, a second spring portion 24, a first arm 25, a second arm 26, an inserted portion 27, and a third spring portion 28.

The main portion 21 has a rectangular plate-like shape and extends in parallel with the X-Z plane. The first spring portion 22 is connected to a lower edge of the main portion 21. In detail, the first spring portion 22 extends inwardly from the lower edge of the main portion 21 and further extends backward. The end portion 23 extends backward continuously from the first spring portion 22 and has a dogleg shape with its corner pointing upward. The second spring portion 24 is connected to a front edge of the main portion 21. In detail, the second spring portion 24 extends inwardly from a center of the front edge of the main portion 21 and further extends backward. The second spring portion 24 has a dogleg shape with its corner pointing toward the space 10a. The first arm portion 25 is connected to a rear edge 21a of the main portion 21 and extends backward. The second arm portion 26 is connected to a rear end of the first arm portion 25. The second arm portion 26 extends outwardly in the Y-direction from the rear end of the first arm portion 25 and further extends backward. The second arm portion 26 has an L-like shape. In the present embodiment, a length of the second arm portion 26 in the Z-direction is smaller than a length of a longitudinal portion of the groove 16d while a length of the first arm portion 25 in the Z-direction is larger than the length of the longitudinal portion of the groove 16d. The inserted portion 27 is connected to the second arm portion 26 and is inserted into the accommodation portion 15b of the front stand portion 15. The third spring portion 28 is formed as a part of the inserted portion 27 and extends obliquely both to the Y-direction and the Z-direction. In other words, the third spring portion 28 extends inward and upward.

Each ground lug 20 is attached to the attached portion 16 by inserting the first arm portion 25 into the groove 16d along the X-direction until the rear edge 21a of the main portion 21 is brought into contact with the receiving portion 16e. Upon the attachment of the ground lug 20 to the attached portion 16, the end portion 23 of the first spring portion 22 slides on the bottom surface 16a in the X-direction and then comes into the depression 16b. The second spring portion 24 moves inside the side slit 16c in the X-direction and is led into the groove 12a so that the corner of the dogleg-shaped second spring portion 24 is positioned inside the groove 12a. As the ground lug 20 moves in the X-direction, the second arm portion 26 moves in the longitudinal portion of the groove 16d. Finally, the inserted portion 27 is inserted into the accommodation portion 15b.

With reference to FIG. 3, in the present embodiment, the leg portions 30 serve as front standoffs, respectively, which provide a space between a front portion of the frame 10 and a circuit board (not shown) when the card connector 1 is mounted on the circuit board. In the present embodiment, a distance between the circuit board and the frame 10 in the Z-direction is determined by the length of the leg portions 30.

In detail, the leg portions 30 are longitudinal in the Z-direction. Each leg portion 30 comprises a projection 31, a first end portion 32, a surface 33, a tongue portion 34, a second end portion 35, and a lock portion 36. The projection 31 projects from the first end portion 32. The surface 33 is parallel to the X-Z plane. The tongue portion 34 extends obliquely to the Y-direction and the Z-direction from the surface 33. In other words, tongue portion 34 extends downward and inward. The second end portions 35 are connected with a circuit board when the card connector 1 is mounted on the circuit board. The lock portion 36 is to be locked with a through-hole (not shown) formed on a circuit board when the card connector 1 is mounted on the circuit board.

Each leg portion 30 is attached to the front stand portion 15 by inserting the leg portion 30 into the groove 15a of the front stand portion 15 until the first end portion 32 is brought into contact with the bottom portion 15d of the groove 15a, as shown in FIG. 5. Upon the attachment of the leg portion 30 to the front stand portion 15, the tongue portion 34 is locked with the depression (not shown) formed on the inner wall of the groove 15a. The leg portion 30 is thus prevented from falling off from the front stand portion 15.

In the present embodiment, the attachment of the leg portion 30 to the front stand portion 15 is carried out after the attachment of the ground lug 20 to the attached portion 16. The attachment order causes the surface 33 of the leg portion 30 to be brought into contact with the third spring portion 28 of the ground lug 20, as shown in FIG. 5, so that the leg portion 30 and the ground lug 20 are electrically connected. The ground lugs 20 and the leg portions 30 connect the electrodes 2b of the card 2 with ground portions of a circuit board when the card connector 1 is mounted on the circuit board and when the card 2 is held by the card connector 1.

With reference to FIG. 3, the shield plate 40 has a long and narrow tubular shape when seen in the X-direction. The shield plate 40 covers the front end portion of the frame 10, as shown in FIGS. 1 and 2. The shield plate 40 and the frame 10 constitute an opening, through which the card 2 is inserted into the space 10a. As shown in FIG. 3, the shield plate 40 comprises two fixing pieces 41, two stopper portions 42, two contact pieces 43 and two front tab portions 44. The fixing pieces 41 project from opposite ends of a bottom surface 40a of the shield plate 40, respectively. Specifically, the fixing pieces 41 constitute parts of a rear end of the shield plate 40. After the ground lugs 20 are attached to the attached portions 16, the shield plate 40 is further attached to the frame 10 so as to cover the ground lugs 20. Upon the attachment of the shield plate 40 to the frame 10, the frame 10 is inserted into the shield plate 40 until the stopper portions 42 are brought into contact with the front surfaces 15c of the front stand portions 15, respectively, so that the fixing pieces 41 are positioned behind the front stand portions 15 as seen in the X-direction. After the contact of the stopper portions 42 to the front stand portions 15, the fixing pieces 41 are bent upward so that the shield plate 40 is fixed to the frame 10, as understood from FIGS. 2 and 3. Under this state, the contact pieces 43 are brought into contact with and are electrically connected to the first spring portions 22 of the ground lugs 20, respectively. The front tab portions 44 extend downward from a front end portion of the bottom surface 40a of the shield plate 40. The front tab portions 44 are formed with the holes 45, respectively. The holes 45 allow the shield plate 40 to be fixed to a case by screws when the card connector 1 is installed within the case. The electrodes 2b are connected to the case via the ground lugs 20 and the shield plate 40 when the shield plate 40 is fixed to the case which serves as the ground, too. With this structure, the card connector 1 has plural electrical paths to be connected to the ground.

With reference to FIG. 3, each of the contacts 50 comprises a first portion 51 and a second portion 52. The first portion 51 extends in the X-direction, and the second portion 52 extends in the Z-direction. Each contact 50 has an L-like shape. As understood from FIGS. 3 and 4, the first portions 51 of the contacts 50 are inserted into the holes 11a of the frame 10, respectively, so that the contacts 50 are held by the frame 10. The first portions 51 extend forward into the space 10a while the second portions 52 extend downward from the frame 10. In other words, the first portions 51 extend along the X-direction, while the second portions 52 extend along the Z-direction.

With reference to FIG. 3, the ground plate 60 is attached to a rear end of the frame 10 and is electrically connected with the contact portions 2c of the card 2 when the card 2 is held by the card connector 1. The ground plate 60 comprises a main portion 61, two side portions 62, a plurality of springs 63, two holes 64, two hooks 65, and two tongue portions 66. The main portion 61 has a plate-like shape and is laid in the X-Y plane. The main portion 61 has opposite ends in the Y-direction. From the ends of the main portion 61, the two side portions 62 extend downward, respectively. The springs 63 are formed as parts of main portion 61. Specifically, the springs 63 are arranged near a front end of the main portion 61. The springs 63 serve to be connected with the contact portions 2c of the card 2. The holes 64 are formed in the side portions 62, respectively. The positions of the holes 64 are near the front end of the side portions 62. The hooks 65 project from the side portions 62, respectively, and extend inwardly in the Y-direction. The tongue portions 66 are positioned near the rear end of the side portions 62, respectively. The tongue portions 66 extend inward and downward, respectively. In other words, the tongue portions 66 extend obliquely both to the Y-direction and the Z-direction. Upon the attachment of the ground plate 60 to the frame 10, the projections 12b of the guide portions 12 are locked with the holes 64, respectively, while the spring portions 66 are locked with the grooves 14a, respectively. The hooks 65 are bent by a jig to be engaged with the recesses 12c of the guide portions 12, respectively, so that the ground plate 60 is fixed to the frame 10.

Figure 7:
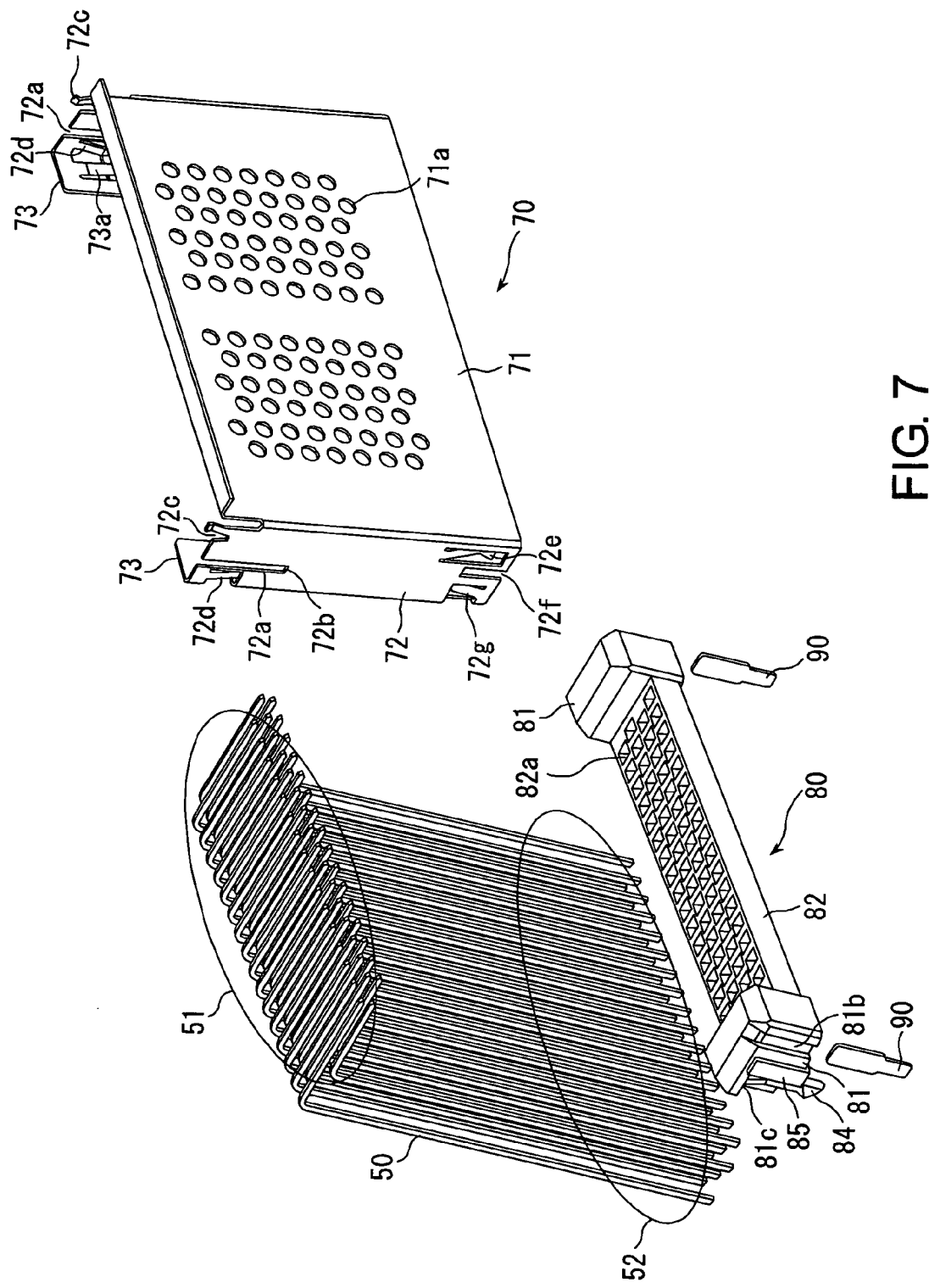
FIG. 7 is a left front oblique view showing a plurality of contacts, the lower shell, a locator, and two posts of FIG. 3.

With reference to FIGS. 3 and 7, the lower shell 70 comprises a front surface 71, two side surfaces 72, and two rear surfaces 73. The front surface 71 extends in parallel with the Y-Z plane. The side surfaces 72 extend in parallel with the X-Z plane. The side surfaces 72 extend in the X-direction from ends of the front surface 71 in the Y-direction, respectively. The rear surfaces 73 extend in parallel with the front surface 71. The rear surface 73 extends from a rear edge of the side surface along the Y-direction. The front surface 71, the side surfaces 72, and the rear surfaces 73 constitute an angular C-like shape when seen in the Z-direction. The front surface 71 is formed with a plurality of holes 71a for the purpose of reducing the weight of the lower shell 70. Each side surface 72 is formed with a first slit 72a, an end part 72b, a first locking portion 72c, a tongue portion 72d, a second locking portion 72e, a second slit 72f, and a lock piece 72g. The first slit 72a extends downward from an upper edge of the side surface 72. The width of the first slit 72a is larger than that of the narrow portion of the projection 14b of the back stand portion 14 but smaller than the wide portion thereof. The first locking portion 72c is positioned nearer to the front surface 71 than the first slit 72a. The tongue portion 72d is positioned nearer to the rear surface 73 than the first sit 72a. The second locking portion 72e is positioned near to the lower edge of the side surface 72. The second slit 72f is positioned nearer to the rear surface 73 than the second locking portion 72e and extends along the Z-direction. The locking piece 72g is positioned nearer to the rear surface 73 than the second slit 72f. Each rear surface 73 is formed with a spring 73a, as shown in FIGS. 6 and 7.

The attachment of the lower shell 70 to the frame 10 is carried out after the attachment of the ground plate 60 to the frame 10. When the lower shell 70 is attached to the frame 10, the narrow portion of the projection 14b of the back stand portion 14 is inserted into the first slit 72a until the end part 72b of the first slit 72a is brought into contact with the lower end surface 14c of the back stand portion 14. In this state, the first locking portion 72c is in contact with the side portion 62 of the ground plate 60 so that the electrical connection is established therebetween. The tongue portion 72d is locked with the recess 14d so that the lower shell 70 is fixed to the back stand portion 14.

With reference to FIGS. 3 and 7, the locator 80 is supported by the lower shell 70. The locator 80 comprises two supported portions 81, a holding portion 82, two positioning bosses 83, two locator hooks 84, and two projections 85. The supported portions 81 are supported by the lower shell 70. In the present embodiment, each supported portion 81 has a block-like shape and has a surface 81a and an outer side surface. The surface 81a is to be placed on a circuit board when the card connector 1 is mounted on the circuit board. A groove 81b and a depression 81c are formed on the outer side surface of each supported portion 81. The groove 81b extends in the Z-direction. An upper part of the groove 81b has a T-like shape in the X-Y plane while a lower part of the groove 81b has a rectangular shape in the X-Y plane. As shown in FIGS. 6 and 7, the depression 81c is positioned nearer to the rear surface 73 than the groove 81b when the locator 80 is supported by the lower shell 70. The holding portion 82 is positioned between the supported portions 81 in the Y-direction. The holding portion 82 has a plate-like shape. The holding portion 82 is formed with a plurality of holes 82a penetrating the holding portion 82 in the Z-direction. The positioning boss 83 and the locator hook 84 are formed on the surface 81a of the supported portion 81. The positioning boss 83 determines the position of the surface 81a when the locator 80 is mounted on a circuit board. The locator hook 84 fixes the supported portion 81 to the circuit board. As shown in FIGS. 3, 6 and 7, the positioning boss 83 and the locator hook 84 protrude downward from the surfaces 81a. Each protrusion 85 is formed on the outer side surface of the supported portion 81. The protrusion 85 has a T-like shaped cross section in the X-Y plane. The protrusion 85 is positioned between the groove 81b and the depression 81c in the X-direction. The second portions 52 of the contacts 50 are inserted into the holes 82a of the holding portion 82, respectively, so that the second portions 52 are arranged in predetermined positions, respectively, while the ends of the second portions 52 protrude downward from the holding portion 82. The second portions 52 are thus held by the locator 80. The locator 80 is attached and fixed to the lower shell 70 by inserting the narrow portion of the projections 85 into the second slits 72f of the lower shell 70, respectively. The locking piece 72g of the lower shell 70 is locked with the depression 81c of the locator 80 so that the locator 80 is firmly supported by the lower shell 70.

With reference to FIGS. 3 and 7, the posts 90 are inserted into the recesses 81b and are supported by the supported portions 81, respectively. A lower end of each post 90 protrudes downward from the supported portion 81. As shown in FIG. 6, the second locking portion 72e is in contact with the post 90 within the groove 81b. The lower shell 70 and the posts 90 are thus electrically connected.

With reference to FIGS. 3 and 6, the upper shell 100 is electrically connected with the ground plate 60 and the lower shell 70. The upper shell 100 comprises a rear surface 101, a top surface 102, and two side portions 103. The rear surface 101 has a plate-like shape extending in the X-Y plane. The rear surface 101 is formed with a plurality of holes 101a for the purpose of reducing the weight of the upper shell 100. The top surface 102 extends forward from the upper edge of the rear surface 101. The top surface 102 has opposite ends in the Y-direction. From the ends of the top surface 102, the side portions 103 extend downward, respectively. Each side portion 103 is formed with a tongue portion 104. As understood from FIG. 6, the attachment of the upper shell 100 carried out after the other components are assembled. Upon the attachment of the upper shell 100 to the frame 10, the tongue portion 104 is locked with the recess 14e of the back stand portion 14 so that the upper shell 100 is fixed to the frame 10. The spring 73a of the lower shell 70 is brought into contact with the rear surface 101 so that the electrical connection is established therebetween. In this embodiment, the electrical path is established between the contact portion 2c of the card 2 and the ground via the ground plate 60, the lower shell 70 and the upper shell 100, and the posts 90.

With reference to FIGS. 1, 2, and 7, the second portion 52 of the contacts 50 is surrounded by the lower shell 70 and the upper shell 100 in the X-Y plane (a plane perpendicular to the Z-direction). In other words, the lower shell 70 and the upper shell 100 constitute a shield that surrounds the second portions 52 of the contacts 50. With this structure, a strong shielding effect can be achieved.

The lower shell 70 of the present embodiment also serves as a back standoff, which determines a position of a back portion of the frame 10 from a circuit board when the card connector is mounted on the circuit board. In this embodiment, the lower shell 70 and the locator 80 are different components which are distinct from each other. With this structure, the height of the standoffs can be increased by simply making the larger lower shell 70.

The present invention is not limited to the above-described structure. For example, in the above described embodiment, the posts 90 are separated components distinct from the lower shell 70. However, the post may be integrally formed with the lower shell 70.

Figure 8:
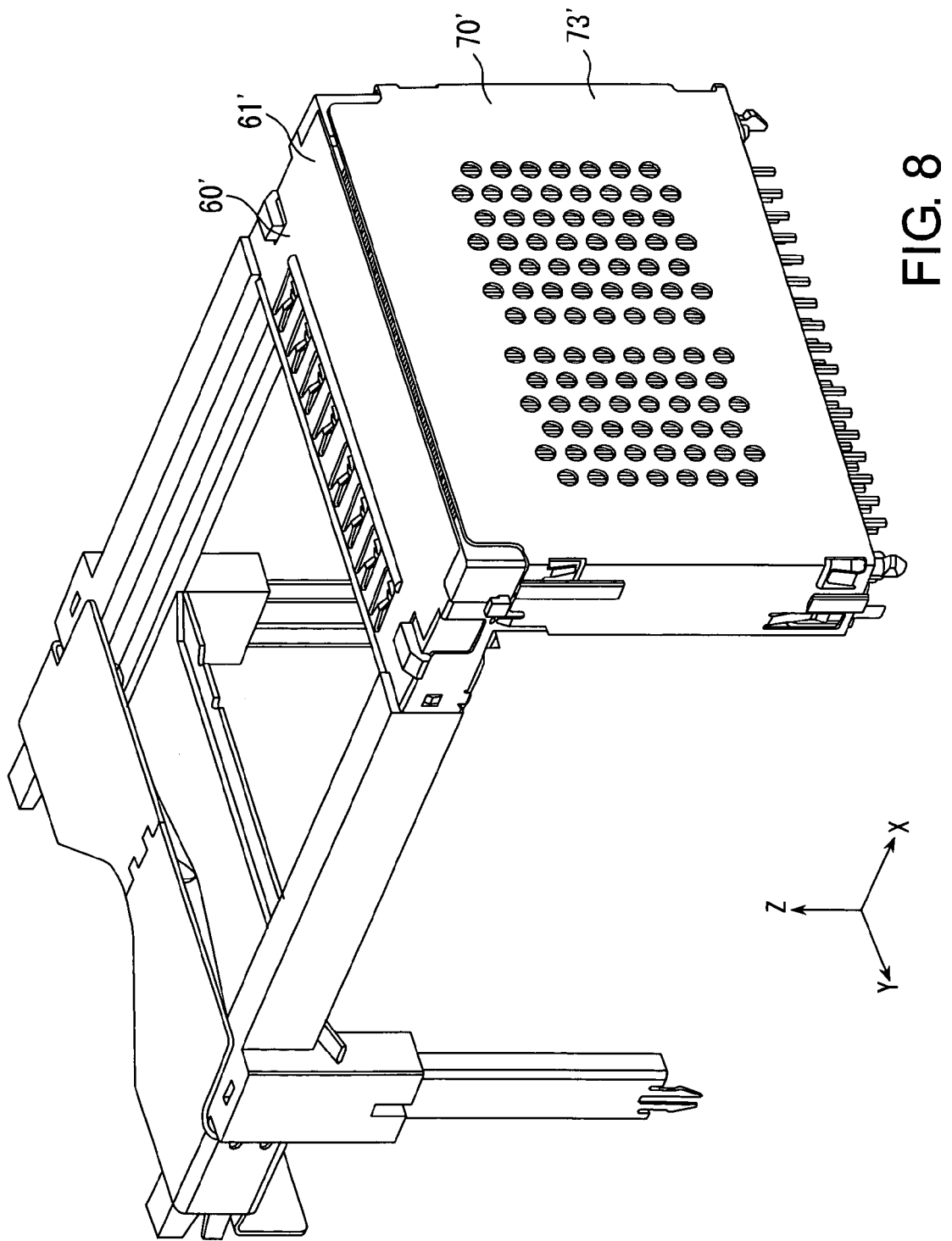
FIG. 8 is a right rear oblique view showing a modification of the card connector of FIG. 1.
Figure 9:
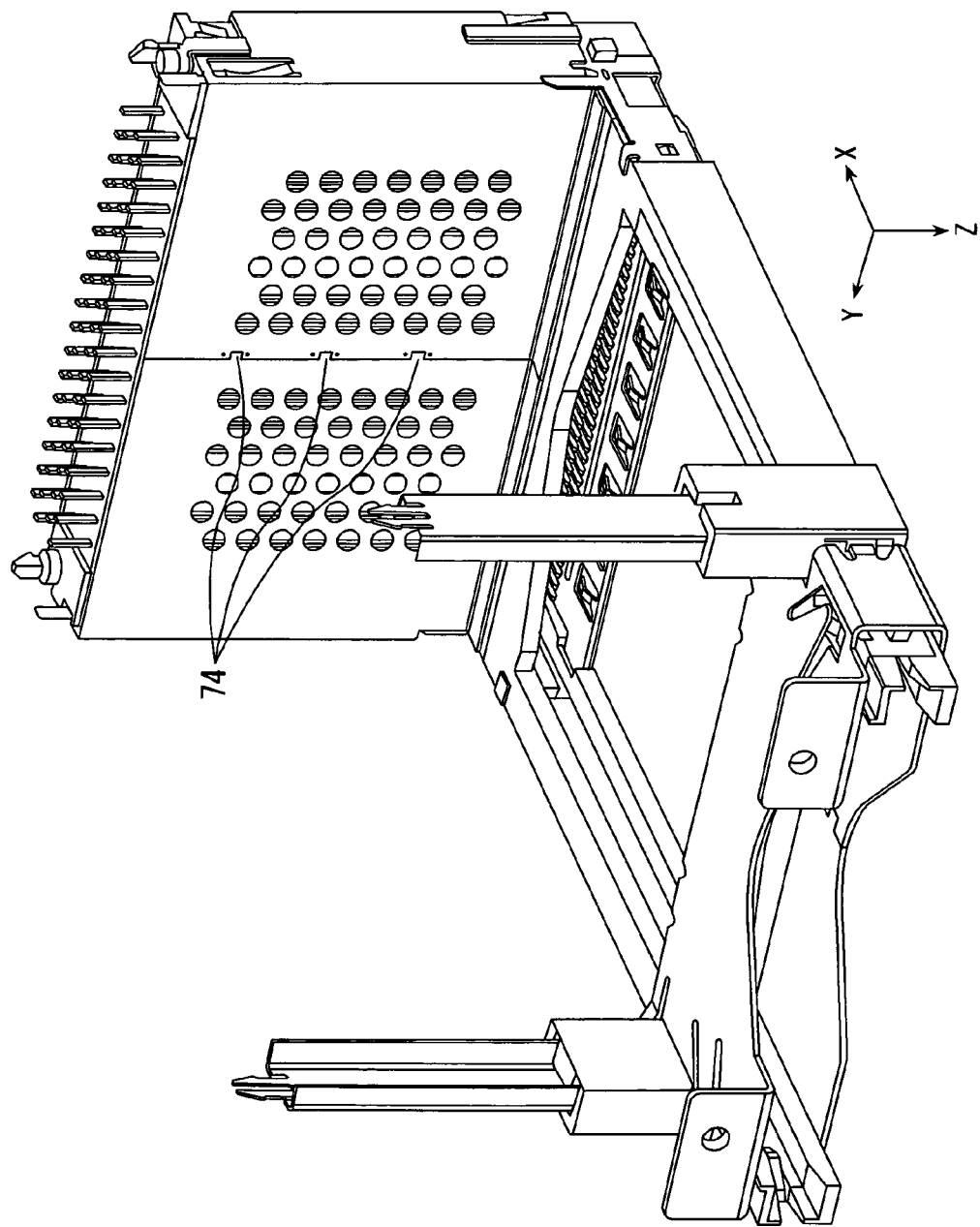
FIG. 9 is a left bottom oblique view of the card connector of FIG. 8.

In the above-described present embodiment, the second portion 52 of the contacts 50 are surrounded by the shield constituted by the lower shell 70 and the upper shell 100. However, as shown in FIGS. 8 and 9, the second portions 52 may be shielded by only the lower shell 70', while the upper shell may be omitted. The lower shell 70' has a portion 73' which covers the second portion 52 of the contacts 50. As best shown in FIG. 9, the portion 73' is formed with caulked portions 74. The lower shell 70' has substantially a rectangular shaped of the cross section in the X-Y plane. In the illustrated example, the main portion 61' of the ground plate 60' extends backward so as to provide the same function as the top portion of the upper shell 100.

The present application is based on a Japanese patent application of JP2008-048874 filed before the Japan Patent Office on Feb. 28, 2008, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A card connector comprising:
   a plurality of contacts each comprising a first portion extending in a first direction and a second portion extending in a second direction perpendicular to the first direction, each contact having an L-like shape;
   a frame having a front end portion and a rear end portion, the rear end portion holding, in part, the first portions of the contacts, the first portions extending into a space defined by the frame toward the front end portion in the first direction, the second portions extending away from the frame in the second direction;
   a shell attached to the frame, the shell shielding, in part, the second portions of the contacts; and
   a locator supported by the shell, the locator being distinct from the shell, the locator holding, in part, the second portions of the contacts so that the second portions penetrate the locator, wherein the card connector further comprises at least one leg portion attached to the frame, the leg portion being distinct from the frame, the shell being attached to the rear end portion of the frame, the leg portion being attached to a position closer to the front end portion of the frame than the rear end portion, the leg portion providing a space between the front end portion of the frame and a circuit board when the card connector is mounted on the circuit board.

2. The card connector according to claim 1, wherein the shell has a shape that surrounds the second portions of the contacts.

3. The card connector according to claim 2, wherein the shell is provided with a plurality of holes.

4. The card connector according to claim 1, wherein the locator has a first surface and a second surface in the second direction, the first surface being closer to the frame than the second surface, the locator further comprising at least one positioning boss protruding from the second surface in the second direction.

5. The card connector according to claim 4, further comprising at least one post attached to the locator, the post protruding from the second surface in the second direction, the post being electrically connected to the shell.

6. The card connector according to claim 4, further comprising at least one post formed integral with the shell, the post protruding from the second surface of the locator in the second direction.

7. The card connector according to claim 1, wherein the frame and the locator are distinct from each other.

* * * * *